United States Patent
Kainuma

(10) Patent No.: US 12,113,329 B2
(45) Date of Patent: Oct. 8, 2024

(54) STEM FOR SEMICONDUCTOR PACKAGE INCLUDING EYELET AND LEAD

(71) Applicant: SHINKO ELECTRIC INDUSTRIES CO., LTD., Nagano (JP)

(72) Inventor: Masao Kainuma, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 394 days.

(21) Appl. No.: 17/645,099

(22) Filed: Dec. 20, 2021

(65) Prior Publication Data

US 2022/0205628 A1 Jun. 30, 2022

(30) Foreign Application Priority Data

Dec. 28, 2020 (JP) ................. 2020-218892

(51) Int. Cl.
| | |
|---|---|
| *H01S 5/0231* | (2021.01) |
| *F21V 31/00* | (2006.01) |
| *H01L 23/13* | (2006.01) |
| *H01L 33/48* | (2010.01) |
| *H01L 33/62* | (2010.01) |
| *H01L 23/14* | (2006.01) |

(52) U.S. Cl.
CPC .......... *H01S 5/0231* (2021.01); *F21V 31/005* (2013.01); *H01L 23/13* (2013.01); *H01L 23/142* (2013.01); *H01L 33/486* (2013.01); *H01L 33/62* (2013.01)

(58) Field of Classification Search
None
See application file for complete search history.

(56) References Cited

U.S. PATENT DOCUMENTS

| | | | | |
|---|---|---|---|---|
| 4,877,756 | A * | 10/1989 | Yamamoto | ............... G11B 7/22 257/82 |
| 5,214,660 | A * | 5/1993 | Masuko | .............. H01S 5/02476 372/36 |
| 6,034,424 | A * | 3/2000 | Fujimura | ............. G02B 6/4204 257/E31.118 |
| 6,090,642 | A * | 7/2000 | Kamibayashi | ........ H01S 5/0232 438/121 |
| 9,273,914 | B2 * | 3/2016 | Taniguchi | ........... H01L 31/0203 |
| 2002/0018500 | A1 * | 2/2002 | Aikiyo | ............... H01S 5/02476 372/36 |
| 2004/0095063 | A1 * | 5/2004 | Murazaki | .............. H01L 33/504 313/503 |
| 2004/0240497 | A1 * | 12/2004 | Oomori | ............... H01S 5/02212 372/36 |

(Continued)

FOREIGN PATENT DOCUMENTS

| | | | | | |
|---|---|---|---|---|---|
| CN | 105914578 | A | * | 8/2016 | ......... H01S 5/02236 |
| CN | 111834302 | A | * | 10/2020 | ........... H01L 23/055 |

(Continued)

*Primary Examiner* — Scott B Geyer
(74) *Attorney, Agent, or Firm* — IPUSA, PLLC

(57) ABSTRACT

A stem for a semiconductor package includes an eyelet having a through hole formed therethrough, a lead extending through the through hole, and a sealing part configured to seal the through hole around the lead, wherein a main material of the eyelet is 45% Ni—Fe, and wherein a thermal expansion coefficient of the eyelet is greater than a thermal expansion coefficient of the sealing part.

10 Claims, 2 Drawing Sheets

(56) References Cited

U.S. PATENT DOCUMENTS

| | | | |
|---|---|---|---|
| 2005/0111503 A1* | 5/2005 | Ishigami | H01S 5/02345 372/38.1 |
| 2005/0121684 A1* | 6/2005 | Aruga | G02B 6/4292 257/98 |
| 2006/0081866 A1* | 4/2006 | Takahashi | H01L 31/0203 257/E31.118 |
| 2007/0120134 A1* | 5/2007 | Oshima | H01S 5/02345 257/82 |
| 2009/0067469 A1* | 3/2009 | Sato | H01S 5/02253 372/109 |
| 2011/0068679 A1* | 3/2011 | Sawamura | H01L 33/483 313/498 |
| 2012/0033696 A1* | 2/2012 | Hayashi | H01S 5/0232 372/43.01 |
| 2012/0177076 A1* | 7/2012 | Tamaya | H01S 5/02212 372/44.01 |
| 2013/0195134 A1* | 8/2013 | Okahisa | H01S 5/0235 372/43.01 |
| 2013/0250987 A1* | 9/2013 | Fujimoto | H01S 5/02469 372/36 |
| 2014/0241388 A1* | 8/2014 | Yamanaka | H01S 5/024 372/43.01 |
| 2014/0328595 A1* | 11/2014 | Han | H01S 5/023 398/115 |
| 2015/0125162 A1* | 5/2015 | Pfnuer | H01S 5/023 398/201 |
| 2018/0145003 A1* | 5/2018 | Shirasaki | H01S 5/0239 |
| 2018/0175584 A1* | 6/2018 | Nakazawa | H01S 5/02212 |
| 2018/0337165 A1* | 11/2018 | Migita | H01L 33/58 |
| 2019/0013442 A1* | 1/2019 | Morita | H01L 23/055 |
| 2019/0019925 A1* | 1/2019 | Morita | H01L 33/62 |
| 2020/0067268 A1* | 2/2020 | Kunitomo | H01S 5/32308 |
| 2020/0313387 A1* | 10/2020 | Fuchi | H01S 5/02415 |
| 2020/0313398 A1* | 10/2020 | Ishida | H01L 23/045 |
| 2020/0373729 A1* | 11/2020 | Enya | H01S 5/02476 |
| 2021/0132305 A1* | 5/2021 | Noguchi | G02B 6/4281 |
| 2021/0336410 A1* | 10/2021 | Tajiri | H01S 5/02212 |
| 2022/0069540 A1* | 3/2022 | Wai Li | H01L 23/045 |
| 2022/0069544 A1* | 3/2022 | Wai Li | H01L 23/04 |
| 2024/0006839 A1* | 1/2024 | Shirasaki | H01L 23/12 |

FOREIGN PATENT DOCUMENTS

| | | | | |
|---|---|---|---|---|
| JP | 2009-176764 | | 8/2009 | |
| JP | 6642749 | B1 * | 2/2020 | H01S 5/023 |
| JP | 6958772 | B1 * | 11/2021 | H01S 5/02212 |
| KR | 100824922 | B1 * | 4/2008 | H01S 3/0941 |

* cited by examiner

STEM FOR SEMICONDUCTOR PACKAGE INCLUDING EYELET AND LEAD

CROSS-REFERENCE TO RELATED APPLICATIONS

The present application is based on and claims priority to Japanese Patent Application No. 2020-218892 filed on Dec. 28, 2020, with the Japanese Patent Office, the entire contents of which are incorporated herein by reference.

FIELD

The disclosures herein relate to stems for semiconductor packages.

BACKGROUND

As known in the art, a stem for a semiconductor package having a light emitting device mounted thereon may be configured such that a metal block is disposed in a protruding fashion over the upper face of a disk-shaped eyelet, with one face of the metal block serving as a device mounting surface on which a light emitting device is mounted. The eyelet has through holes into which leads are inserted. The through holes are sealed with a sealing part such as glass around the leads.

The stem for a semiconductor package as noted above may have a laser mounted as a light emitting device to be used for high-speed optical communication. In such a case, the impedance of a glass sealing part needs to be adjusted to be close to a proper value for the purpose of achieving satisfactory high-frequency characteristics. To this end, materials that have not previously been used have been studied for use as the materials for eyelets and sealing parts, for example.

However, the materials of an eyelet and a sealing part affects the sealing quality around leads. As a result, there is a risk that the sealing quality around leads become insufficient when the impedance of the glass sealing part around leads is brought closer to a proper value.

Accordingly, there may be a need to provide a stem for a semiconductor package that ensures proper sealing around leads.

RELATED-ART DOCUMENTS

Patent Document

[Patent Document 1] Japanese Laid-open Patent Publication No. 2009-176764

SUMMARY

According to an aspect of the embodiment, a stem for a semiconductor package includes an eyelet having a through hole formed therethrough, a lead extending through the through hole, and a sealing part configured to seal the through hole around the lead, wherein a main material of the eyelet is 45% Ni—Fe, and wherein a thermal expansion coefficient of the eyelet is greater than a thermal expansion coefficient of the sealing part.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments will be described by referring to the accompanying drawings. In these drawings, the same elements are referred to by the same references, and a duplicate description thereof may be omitted.

Figure 1B:
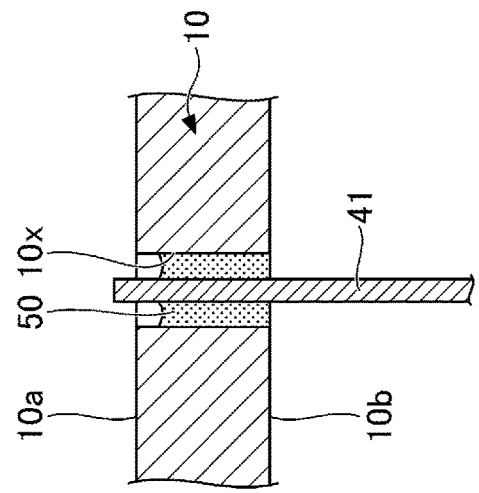
FIGS. 1A and 1B are drawings illustrating an example of a stem for a semiconductor package according to an embodiment.
Figure 1A:
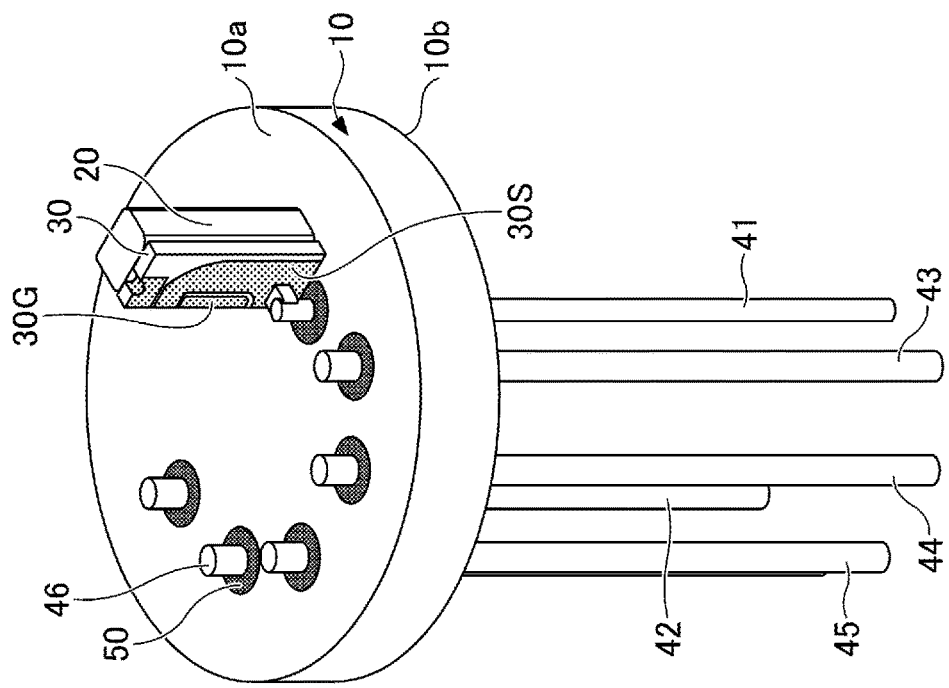
Figure 2:
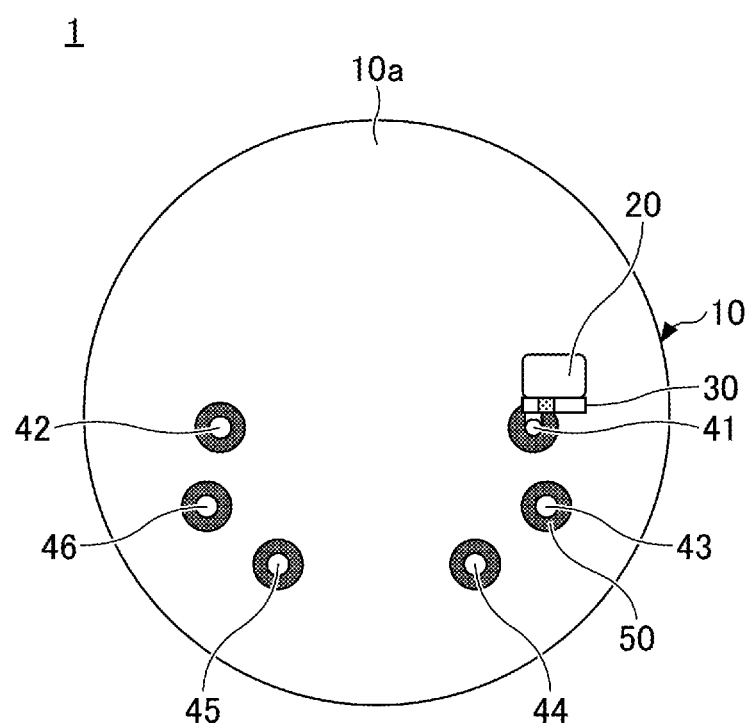
FIG. 2 is a plan view illustrating the example of the stem for a semiconductor package according to the embodiment.

FIGS. 1A and 1B are drawings illustrating an example of a stem for a semiconductor package according to a present embodiment. FIG. 1A illustrates an axonometric view, and FIG. 1B illustrates an enlarged partial cross-sectional view of a portion of the stem around a lead. FIG. 2 is a plan view illustrating an example of a stem for a semiconductor package according to the present embodiment.

Referring to FIGS. 1A and 1B and FIG. 2, a stem 1 for a semiconductor package according to the present embodiment includes an eyelet 10, a metal block 20, a substrate 30, a first lead 41, a second lead 42, a third lead 43, a fourth lead 44, a fifth lead 45, a sixth lead 46, and a sealing part 50. The stem 1 for a semiconductor package may be used, for example, as a stem for a laser in optical communications. The substrate 30 is provided according to need.

The eyelet 10 is a disk-shaped member. The diameter of the eyelet 10, which is not limited to a particular value, and can properly be determined depending on the application, may be, for example, 3.8 mm or 5.6 mm. The thickness of the eyelet 10, which is not limited to a particular value, and can properly be determined depending on the application, may approximately be, for example, 1.0 mm to 1.5 mm, for example. The eyelet 10 may be formed, for example, of a metallic material. The surface of the eyelet 10 may be treated with gold plating or the like.

In this application, the term "disc-shaped" object refers to an object whose plane shape is generally circular and has a predetermined thickness. How thick the object is relative to the diameter does not matter. Further, the object may have a local recess and/or a local bulge, and may have a through hole. In the present application, a plan view refers to a view taken in the direction perpendicular to an upper surface 10a of the eyelet 10, and a plane shape refers to the shape of an object as viewed in the direction perpendicular to the upper surface 10a of the eyelet 10.

One or more notches may be formed in the outer perimeter of the eyelet 10, and may be recessed toward the center of the eyelet 10 from the perimeter thereof in a plan view. The notches may, for example, each have a generally triangular or rectangular plane shape. The notches may be used, for example, to determine the position of a device mounting surface when a light emitting device is mounted to the stem 1 for a semiconductor package. The notches may also be used, for example, to determine the position of the stem 1 for a semiconductor package in a rotational direction.

The metal block 20 is a columnar member projecting from the upper surface 10a of the eyelet 10. The lateral face of the metal block 20 which faces toward the first lead 41 is a substrate securing surface for securing the substrate 30.

The metal block 20 may be formed, for example, of a metallic material such as iron or copper. The metal block 20 is bonded to the eyelet 10 with an electrically conductive material such as, for example, a brazing filler material. The metal block 20 is a rectangular parallelepiped, for example, but may be of any shape as long as the substrate 30 can be secured thereon.

The substrate 30 is secured on the substrate securing surface of the metal block 20. The front surface of the substrate 30 (i.e., the surface facing toward the first lead 41) has interconnects formed thereon that include a signal pattern 30S and a ground pattern 30G. The back surface of the substrate 30 (i.e., the surface facing toward the metal block 20) is fully covered with a ground pattern 30G. The ground pattern 30G on the front surface of the substrate 30 and the ground pattern 30G on the back surface of the substrate 30 are electrically connected to each other via a through hole extending through the substrate 30.

The back surface of the substrate 30 is secured on the substrate securing surface of the metal block 20 with an electrically conductive material such as a brazing filler material (e.g., a gold-tin alloy). With this arrangement, the ground pattern 30G on the back surface of the substrate 30 is electrically coupled with the metal block 20, so that the metal block 20 is set to the ground potential (i.e., reference potential).

The substrate 30 may be made of ceramic, for example. More specifically, the substrate 30 is made, for example, of aluminum oxide (i.e., alumina) or aluminum nitride. The signal pattern 30S and the ground pattern 30G may be formed of, for example, tungsten, titanium, gold, or the like. Gold plating or the like may be formed on the surface of the signal pattern 30S and the ground pattern 30G.

The first lead 41, the second lead 42, the third lead 43, the fourth lead 44, the fifth lead 45, and the sixth lead 46 have a longitudinal direction thereof aligned with the thickness direction of the eyelet 10, and are inserted into through holes 10x which extend through the eyelet 10 from the upper surface 10a to a lower surface 10b. Sealing parts 50 seal the space inside the through holes 10x around the first lead 41, the second lead 42, the third lead 43, the fourth lead 44, the fifth lead 45, and the sixth lead 46.

A portion of the first lead 41 protrudes upwardly from the upper surface 10a of the eyelet 10. The length of the portion of the first lead 41 protruding from the upper surface 10a of the eyelet is approximately 0 to 0.3 mm, for example. The second lead 42, the third lead 43, the fourth lead 44, the fifth lead 45, and the sixth lead 46 each have a portion thereof protruding upwardly from the upper surface 10a of the eyelet 10. The length of the portions that are part of the second lead 42, the third lead 43, the fourth lead 44, the fifth lead 45 and the sixth lead 46, and that protrude from the upper surface 10a of the eyelet 10 is approximately 0 to 2 mm, for example.

The first lead 41, the second lead 42, the third lead 43, the fourth lead 44, the fifth lead 45, and the sixth lead 46 each have a portion thereof protruding downwardly from the lower surface 10b of the eyelet 10. The length of the portions that are part of the first lead 41, the second lead 42, the third lead 43, the fourth lead 44, the fifth lead 45 and the sixth lead 46, and that protrude from the lower surface 10b of the eyelet 10 is approximately 6 to 10 mm, for example.

The first lead 41, the second lead 42, the third lead 43, the fourth lead 44, the fifth lead 45, and the sixth lead 46 are made of, for example, a metal, and the sealing parts 50 are made of an insulating material such as glass. Gold plating or the like may be formed on the surface of the first lead 41, the second lead 42, the third lead 43, the fourth lead 44, the fifth lead 45, and the sixth lead 46.

The portion of the first lead 41 protruding upwardly from the upper surface 10a of the eyelet 10 is electrically coupled to the signal pattern 30S of the substrate 30 via a brazing filler material (e.g., a gold-tin alloy) or the like. This facilitates the attainment of impedance matching. The first lead 41 serves as a signal path which is electrically coupled via the signal pattern 30S to the light emitting device mounted on the stem 1 for a semiconductor package. The second lead 42, the third lead 43, the fourth lead 44, the fifth lead 45, and the sixth lead serve as a ground or signal paths which are electrically coupled to devices or sensors mounted on the stem 1 for a semiconductor package. The devices or sensors mounted on the stem 1 for a semiconductor package are, for example, a Peltier device or a temperature sensor. The number of leads is not limited to a particular number, and may be changed according to need.

The wire diameters (i.e., diameters) of the first lead 41, the second lead 42, the third lead 43, the fourth lead 44, the fifth lead 45, and the sixth lead 46 are, for example, greater than or equal to 0.2 mm and less than or equal to 0.4 mm. As was previously noted, the first lead 41 serves as a signal path which is electrically coupled to the light emitting device mounted on the stem 1 for a semiconductor package. In consideration of this, in order to increase the impedance, the wire diameter of the first lead 41 is preferably made as small as possible. From the viewpoint of strength and impedance, the wire diameter of the first lead 41 is preferably greater than or equal to 0.2 mm and less than or equal to 0.25 mm.

On the other hand, the wire diameters of the second lead 42 through the sixth lead 46 used as the ground or the like are preferably made thick to some extent to reduce the impedance, and, to be more specific, are preferably greater than or equal to 0.3 mm and less than or equal to 0.4 mm in consideration of product size. In the stem 1 for a semiconductor package, the wire diameter of the lead serving as a signal path which is electrically coupled to a light emitting device mounted on the stem 1 for a semiconductor package is preferably thinner than the wire diameters of other leads as discussed above.

<Impedance>

Conventionally, the impedance of a glass sealing part around a lead is about 20Ω in a stem for a semiconductor package used for optical communication (for example, at 25 Gbps). However, in recent years, there has been a need for stems for semiconductor packages for use in higher capacity optical communication (for example, at 100 Gbps). In such a case, there is a demand that the impedance of a glass sealing part around a lead be close to 50Ω.

The impedance of a glass sealing part around a lead can be increased by increasing the size of a through hole that receives the lead, reducing the wire diameter of the lead, using a low relative-permittivity material as the sealing part around the lead, and the like. Among these, increasing the size of a through hole that receives the lead is not easy to do due to constraints imposed by product size and the like. The stem 1 for a semiconductor package is thus configured such that the wire diameter of the first lead 41 serving as a signal path is made smaller than the wire diameter of the other leads, and such that the sealing part 50 is made of a material having a lower relative permittivity than that of the conventional material.

The relative permittivity of glass that is used as the sealing part of a conventional stem for a semiconductor package is approximately 8 to 9 (at 25° C. under 1 MHz). In contrast, the stem 1 for a semiconductor package uses, as the material used for the sealing part 50, glass having a lower relative permittivity than the conventionally used glass, in order to increase the impedance of the glass sealing part around a lead.

The relative permittivity (at 25° C. under 1 MHz) of the glass used for the sealing part 50 is preferably greater than or equal to 4 and less than or equal to 7, more preferably greater than or equal to 4 and less than or equal to 6, and even more preferably greater than or equal to 4 and less than or equal to 5. Examples of glass having a relative permittivity (at 25° C. under 1 MHz) greater than or equal to 4 and less than or equal to 7 include, for example, glass containing $Na_2O$, BaO, and $SiO_2$, and glass containing $Na_2O$, $Al_2O_3$, $B_2O_3$, and $SiO_2$. The latter is preferred from the viewpoint of reducing a relative permittivity. In order to attain good radio-frequency characteristics, tan δ (at 25° C. under 1 MHz) of the glass used for the sealing part 50 is preferably less than or equal to $5\times10^{-4}$.

For example, the wire diameter of the first lead 41 may be set to greater than or equal to 0.2 mm and less than or equal to 0.25 mm, and the diameter of the through hole 10x is set to greater than or equal to 0.75 mm and less than or equal to 0.85 mm, with the relative permittivity of the glass used for the sealing part 50 (at 25° C. under 1 MHz) being set to 4. In such a case, the resultant impedance of the first lead 41 is approximately 40Ω.

<Hermetic Sealing>

In the stem 1 for a semiconductor package, the thermal expansion coefficient of the eyelet 10 is set greater than the thermal expansion coefficients of the sealing part 50 and the leads. In the manufacturing process of the stem 1 for the semiconductor package, the leads are inserted into the respective through holes 10x of the eyelet 10, and the glass that becomes the sealing part 50 is injected into gaps around the leads. The glass that becomes the sealing part 50 is melted by being heated together with the eyelet 10, and then cooled to solidify. When this is done, the thermal shrink force of the eyelet 10 having a greater thermal expansion coefficient than those of the sealing part 50 and the leads is utilized to cause the sealing part 50 to become hermetic sealing around each lead for the eyelet 10. Namely, the sealing parts 50 seal the through holes 10x to provide an airtight space surrounded by the eyelet 10 and a cover when the cover (not shown) is attached to the eyelet 10 on the upper surface side thereof.

In the stem 1 for a semiconductor package, the main material of the eyelet is preferably 45% Ni—Fe (i.e., an FeNi alloy having a nickel content of 45%). The term "main material" refers to a material that accounts for 50 wt % or more among all the materials. The eyelet 10 may, for example, contain a component attributable to plating or the like in addition to the main material. The thermal expansion coefficient of 45% Ni—Fe is greater than or equal to $70\times10^{-7}/°$ C. and less than or equal to $80\times10^{-7}/°$ C.

As was previously noted, the main material of the sealing part 50 is preferably a glass having a relative permittivity (at 25° C. under 1 MHz) greater than or equal to 4 and less than or equal to 7. The sealing part 50 may contain a filler or the like in addition to the main material, for example. The thermal expansion coefficient of the glass that is the main material of the sealing part 50 is greater than or equal to $30\times10^{-7}/°$ C. and less than or equal to $35\times10^{-7}/°$ C. In this case, the resultant difference between the thermal expansion coefficient of the eyelet 10 and the thermal expansion coefficient of the sealing part 50 is greater than or equal to $35\times10^{-7}/°$ C. and less than or equal to $50\times10^{-7}/°$ C., thereby enabling hermetic sealing according to the above-described principle.

Although it suffices for the thermal expansion coefficient of each lead to be smaller than the thermal expansion coefficient of the eyelet 10 and to be greater than the thermal expansion coefficient of the sealing part 50, the thermal expansion coefficient of each lead is preferably closer to the thermal expansion coefficient of the sealing part 50. The main material of each lead is preferably Kovar. Each lead contains, for example, a component attributable to plating or the like in addition to the main material. The thermal expansion coefficient of Kovar, which is greater than or equal to $45\times10^{-7}/°$ C. and less than or equal to $55\times10^{-7}/°$ C., is less than the thermal expansion coefficient of the eyelet 10 and greater than the thermal expansion coefficient of the sealing part 50. Use of the leads having a thermal expansion coefficient less than the thermal expansion coefficient of the eyelet 10 and greater than the thermal expansion coefficient of the sealing part 50 facilitates hermetic sealing.

TABLE 1

| | Heating Temperature | | | | |
|---|---|---|---|---|---|
| | 300° C. | 350° C. | 380° C. | 400° C. | 420° C. |
| Number of Samples with Leakage | 0/10 | 0/10 | 0/10 | 0/10 | 0/10 |

Table 1 provides results obtained by making 10 samples of the stem 1 for a semiconductor package and checking the occurrence of leakage upon changing ambient temperature. In each sample of the stem 1 for a semiconductor package, 45% Ni—Fe with a thermal expansion coefficient of $75\times10^{-7}/°$ C. was used as the main material of the eyelet 10. As the main material of the sealing part 50, a glass having a relative permittivity of 4 (at 25° C. under 1 MHz) and a thermal expansion coefficient of $31.5\times10^{-7}/°$ C. was used. Kovar was used as the main material of the first lead 41, and the wire diameter thereof was 0.22 mm. Kovar was used as the main material of the other leads, and the wire diameter thereof was 0.35 mm. Leakage was measured by a He leak detector.

As shown in Table 1, no leakage was found for any sample at any temperature. In other words, the above-described combination of main materials used in the making of each sample was confirmed to enable hermetic sealing based on the thermal shrink force of the eyelet 10.

As described above, the stem 1 for a semiconductor package is configured such that a glass having a relative permittivity (at 25° C. under 1 MHz) greater than or equal to 4 and less than or equal to 7 is used as the main material of the sealing part 50, and the wire diameter of the first lead 41 is set to a small diameter that is greater than or equal to 0.2 mm and less than or equal to 0.25 mm. With this arrangement, the first lead 41, which serves as a signal path electrically coupled to a light emitting device mounted on the stem 1 for a semiconductor package, has an impedance close to 50Ω.

In the stem 1 for a semiconductor package, the thermal expansion coefficient of the eyelet 10 is set greater than the thermal expansion coefficients of the sealing part 50 and the leads. Specifically, a glass having a relative permittivity (at 25° C. under 1 MHz) greater than or equal to 4 and less than or equal to 7 is used as the main material of the sealing part 50, and 45% Ni—Fe is used as the main material of the eyelet 10. This arrangement enables hermetic sealing based on the thermal shrink force of the eyelet 10 as previously described.

According to at least one embodiment, a stem for a semiconductor package that ensures proper sealing around leads is provided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A stem for a semiconductor package, comprising:
   an eyelet having a through hole formed therethrough;
   a lead extending through the through hole; and
   a sealing part configured to seal the through hole around the lead,
   wherein a main material of the eyelet has a nickel content of 45% and an iron content of 55%, and
   wherein a thermal expansion coefficient of the eyelet is greater than a thermal expansion coefficient of the sealing part.

2. The stem for a semiconductor package as claimed in claim 1, wherein a main material of the sealing part is glass.

3. The stem for a semiconductor package as claimed in claim 2, wherein a relative permittivity of the glass is greater than or equal to 4 and less than or equal to 7.

4. The stem for a semiconductor package as claimed in claim 1, wherein a thermal expansion coefficient of the lead is less than the thermal expansion coefficient of the eyelet and greater than the thermal expansion coefficient of the sealing part.

5. The stem for a semiconductor package as claimed in claim 4, wherein a main material of the lead is an alloy of nickel, iron, and cobalt.

6. The stem for a semiconductor package as claimed in claim 1, further comprising a substrate fixed to the eyelet,
   wherein the lead is electrically coupled to an interconnect of the substrate.

7. The stem for a semiconductor package as claimed in claim 6, wherein the substrate is made of ceramic.

8. The stem for a semiconductor package as claimed in claim 7, wherein the substrate is made of aluminum oxide or aluminum nitride.

9. The stem for a semiconductor package as claimed in claim 6, wherein the lead serves as a signal path which is electrically coupled to a light emitting device mounted to the eyelet.

10. The stem for a semiconductor package as claimed in claim 6, wherein the eyelet has an additional through hole, and
    wherein an additional lead extends through the additional through hole, and a wire diameter of the lead is less than a wire diameter of the additional lead.

* * * * *